United States Patent [19]
Lee

[11] Patent Number: 5,281,297
[45] Date of Patent: Jan. 25, 1994

[54] METHOD OF SUPPORTING WAFER, WAFER SUPPORTING APPARATUS AND WAFER MOUNTER HAVING THE APPARATUS

[75] Inventor: Masahiro Lee, Sakai, Japan

[73] Assignee: Teikoku Seiki Kabushiki Kaisha, Osaka, Japan

[21] Appl. No.: 796,551

[22] Filed: Nov. 22, 1991

[30] Foreign Application Priority Data

Aug. 9, 1991 [JP] Japan ................. 3-225156

[51] Int. Cl.$^5$ ............................. B32B 31/04
[52] U.S. Cl. .................... 156/552; 269/21; 279/3
[58] Field of Search ........... 156/391, 538, 552; 269/21; 279/3

[56] References Cited

U.S. PATENT DOCUMENTS

| | | | |
|---|---|---|---|
| 3,955,163 | 5/1976 | Novak | 279/3 X |
| 4,603,466 | 8/1986 | Morley | 279/3 X |
| 4,696,712 | 9/1987 | Nonaka | 156/64 X |
| 5,033,538 | 7/1991 | Wagner et al. | 269/21 X |
| 5,171,398 | 12/1992 | Miyamoto | 156/552 |

FOREIGN PATENT DOCUMENTS

| | | |
|---|---|---|
| 256952 | 5/1988 | Fed. Rep. of Germany ........ 269/21 |
| 62-287639 | 12/1987 | Japan . |
| 63-166243 | 7/1988 | Japan . |

Primary Examiner—David A. Simmons
Assistant Examiner—Mark A. Osele
Attorney, Agent, or Firm—Edwin E. Greigg; Ronald E. Greigg

[57] ABSTRACT

A method of supporting a wafer comprising the steps of: dividing a pressure space formed between the table plate and the wafer into a first pressure space and a second pressure space by means of a pressure setting wall, setting a supporting pressure of a compressed air supplied to the first pressure space, by a throttle function of a throttle passage formed between a pressure regulating wall and the wafer, and determining a further supporting pressure of the compressed air supplied from the first pressure space to the second pressure space through the throttle passage, by a throttle function of a throttle opening for connecting the second pressure space with the atmosphere. A wafer supporting apparatus for carrying out the method and a wafer mounter having the apparatus.

6 Claims, 8 Drawing Sheets

METHOD OF SUPPORTING WAFER, WAFER SUPPORTING APPARATUS AND WAFER MOUNTER HAVING THE APPARATUS

BACKGROUND OF THE INVENTION (1) Field of the Invention

The present invention relates to a method of supporting a wafer, a wafer supporting apparatus and a wafer mounter having the apparatus, which are used when a plastic tape is applied to the wafer.

(2) Prior Art

A number of semiconductor elements are sheared from a wafer in length and breadth. When the semiconductor elements are divided from the wafer, a plastic tape is applied to the reverse side of the wafer prior to division of the wafer in order to prevent the divided semiconductor elements from separating unnecessarily. The taping operation is carried out automatically by utilizing a so called table mounter.

Normally, the table mounter is constructed as follows. A wafer take-in device takes in wafers one by one from a wafer stock jig and after regulating a direction of the wafer by means of a wafer direction determining device, the wafer is transfer device in such a state that the wafer is rotated. On the other hand, an outer frame direction determining device takes in an outer frame one by one from an outer frame stock jig and regulates a direction of the outer frame and thereafter the outer frame is transferred to the tape applying stage by means of an outer frame transfer device. Thereafter, a tape applying device presses and applies a tape to the wafer which is supported by a wafer supporting device on the tape applying stage, and also to the outer frame which is supported by the outer frame supporting device on the tape applying stage. Then, unnecessary portions of the tape applied to the wafer and the outer frame are cut and removed by a cutting device, and the wafer, the outer frame and the tape, which are adhered to one another, are transferred by a conveying device from the tape applying stage into a predetermined jig such as the outer frame stock jig.

Transfer of the wafer and transfer of the outer frame to the tape applying stage may be carried out at the same time in order to shorten a cycle time. Further, the transfer may be carried out sequentially step by step in order to prevent crossing operations of the wafer transfer device and the outer frame transfer device.

For example, as shown in FIG. 8, a wafer supporting device 100 as mentioned above comprises a table plate 101, a receiver 102 in the shape of substantially a ring which projects from the upper surface of the table plate 101 to correspond to a peripheral edge of a wafer W, a vacuum opening 103 formed with the upper surface of the receiver 102 and connected to a vacuum source, a pressure space 104 formed between the table plate 101 and the wafer W which is set reversely on the receiver 102, and a compressed air supplying opening 105 formed with the upper surface of the table plate 101 and inside the receiver 102 and connected to a compressed air supplying source.

The peripheral portion of the wafer W is sucked to the receiver 102 immediately after the wafer is set reversely on the receiver 102 and immediately before removing it. When a tape applying device applies a tape to the wafer, a compressed air, the pressure of which is controlled by a micro-regulator, is supplied from the compressed air supplying source in order to support the wafer W.

In the prior art, where the supporting pressure acting on the wafer W from the pressure space 104 is set greater than the sucking pressure acting on the receiver 102 for sucking the peripheral portion of the wafer W, it becomes unstable to secure the wafer W onto the receiver 102, and as the result it is in danger of displacement of the wafer W. Therefore, the supporting pressure acting on the wafer W cannot be set greater than the sucking pressure for sucking the peripheral portion of the wafer W onto the receiver 102.

Further, the sucking force acting on the peripheral portion of the wafer W corresponds to an opening area of the sucking opening 103, but the opening area of the sucking opening 103 substantially corresponds to a size of the wafer W. Therefore, the sucking force acting on the peripheral portion of the wafer W is limited corresponding to a size of the wafer W and this means that the supporting pressure acting on the wafer W is also limited corresponding to a size of the wafer W. Further, a size of the opening area of the sucking opening 103 is in proportion to a diameter of the wafer W where the opening width of the sucking opening in a radial direction thereof is the same regardless of the size of the area of the sucking opening. On the other hand, the area of the pressure space 104 contacting the wafer W is in proportion to a diameter of the wafer W by self-multiplication and therefore the supporting pressure per area for the wafer becomes smaller as the diameter of the wafer becomes larger. As a the result, when the diameter of the wafer becomes large, the supporting pressure becomes insufficient so that the wafer W cannot be sufficiently pressed to the tape and bubbles may sometimes occur between the wafer W and the tape.

Particularly, according to the above conventional art, the tape cannot be applied to the wafer W having a diameter of 8 inches without occurring bubbles between the wafer W and the tape, and bubbles may sometimes occur in applying the tape to the wafer W having a diameter of 5 inches.

Where the bubble occurs between the wafer W and the tape, a problem may occur such that the semiconductor elements are blown out due to popping of the bubbles at the time of division into pieces, and that the semiconductor elements supported by the tape may be damaged by the semiconductor elements which are blown out.

SUMMARY OF THE INVENTION

The present invention has been achieved in view of the above mentioned circumstances and has an object to provide a method of supporting a wafer, a wafer supporting apparatus and a wafer mounter having the apparatus, which are capable of applying a tape to a wafer of large diameter.

In order to achieve the object, the method of supporting a wafer according to the present invention is first based on the method comprising the steps of setting the wafer and an outer frame on a table plate front-to-back, pressing and applying a tape to the reverse sides of each of the wafer and the outer frame by means of a roller while securing a peripheral portion of the wafer, and applying a supporting pressure (back-up pressure) on a surface of the wafer by means of a compressed air, and then applying the following steps.

Namely, the method further comprises the steps of dividing a pressure space formed between the table plate and the wafer into a first pressure space of a center portion of the table plate and a second pressure space of a peripheral portion of the table plate by means of a pressure setting wall which projects from the table plate to a position in the vicinity of the wafer, setting a supporting pressure (back-up pressure) of a compressed air, which is supplied from a compressed air source to the first pressure space, by means of a throttle function of a throttle passage formed between the pressure regulating wall and the wafer, and setting a further supporting pressure of a compression air, which is supplied from the first pressure space to the second pressure space through the throttle passage, by means of a throttle function of a throttle opening for communicating the second pressure space with the atmosphere.

In the method of supporting the wafer according to the present invention it is sufficient to use such a tape which is adherent to the wafer under pressure and it may comprise a base tape with a side which provides an adhesive or tacky layer.

As the base tape, it may consist one which comprises a thermoplastic resin or a thermosetting resin, and practically for example cellophane, cellulose acetate, polyethylene, polypropylene, polyvinyl chloride, polystyrene, polyester such as polyethylene terephthalate, polycarbonate, polyamide, or polyimide.

As the tacky layer formed on a side of the base tape, it may use a tacky adhesive agent which may adhere to ceramics which is normally used as a material of the wafer, and to metal which comprises the outer frame. The tacky adhesive agent may consist of for example epoxy resin, vinyl acetate, polyvinyl alcohol, polyvinyl acetal, vinylchloride, polyamide, polyethylene, cellulose, acrylic resin, chloroprene(neoprene), nitrile rubber, styrene rubber, polysulfide, isobutylene rubber, or silicon rubber.

As the adhesive agent used in the present invention, it may use a hot-melt (thermoplastic) adhesive agent which may adhere to ceramics which is normally used as a material of the wafer, and to metal which comprises the outer frame. For instance, it may include an adhesive agent of ethlene-vinyl acetate, polyethylene, polyamide, polyester or petroleum resin.

Further, in the method of supporting the wafer according to the present invention, it may freely choose to take a step of supplying an compressed air to the first pressure space after heating the compressed air. Where the heated compression air is supplied, it is advantageous that adhesion of the tape and the wafer may be carried out easily and surely for a short time.

The temperature of the compressed air may be determined according to the material of the tape which is actually used. Normally, the temperature may be determined within a range of 45° C.~150° C., considering the material of the base tape and the adhesive layer thereof. For example, where the tape comprises a base tape of vinyl chloride and a tacky adhesive agent of epoxy resin, the temperature is set within a range of 60° C.~130° C.

The area of the first pressure space and the clearance between the pressure setting wall and the wafer may be designed according to a supplying pressure of a compressed air and a supporting pressure required for the wafer.

Next, in order to achieve the above mentioned object, a wafer supporting apparatus according to the present invention comprises a table plate, a receiver of substantially ring shape projecting from an upper surface of the table plate corresponding to a peripheral portion of the wafer, a sucking opening formed with an upper surface of the receiver and connected to a vaccum source, a pressure space formed inside the receiver and between the table plate and the wafer which is set on the receiver reversely, and compressed air supplying opening means formed inside the receiver and with the upper surface of the table plate and connected to the compression air source, and then follows the following stops.

Namely, the apparatus further comprises a pressure setting wall of ring shape disposed at a center portion of the table plate to project from the table plate to a position in the vicinity of the wafer set on the receiver and to divide the pressure space into a first pressure space located inside the pressure setting wall and a second pressure space located outside the pressure setting wall, said first pressure space being communicated with the compressed air supplying opening means, and throttle opening means formed with the table plate to communicate the second pressure space with the atmosphere.

In the wafer supporting apparatus of the present invention, in order to carry out adhesion of the wafer and the tape easily and surely for a short time by supplying a compressed air to the first pressure space after heating the air, it is preferable to provide for example a heater to fit the reverse side of the table plate and a terminal portion of a compressed air supplying passage for communicating the compressed air source with the compression air supplying opening disposed inside the heater so as to discharge the heated compressed air, which is heated in the terminal portion, to the first pressure space.

Further, a wafer mounter of the present invention is provided with the wafer supporting apparatus in order to achieve the above mentioned object.

The essential function of the present invention will be described as follows:

The compressed air is supplied to the first pressure space which is surrounded by the pressure setting wall and then the center of the wafer is supported with dynamic and static pressures.

To produce the dynamic pressure, it is better to make the area of the first pressure space smaller, but the necessary supporting pressure cannot be obtained by the dynamic pressure only. Therefore, in order to obtain the supporting pressure necessary for applying a tape to the wafer, it is required to enlarge the area of the first pressure space to a certain extent. The static pressure inside the first pressure space is determined by a throttle function of the throttle passage of ring shape formed between the upper edge of the pressure setting wall and the wafer. Therefore, the wafer may be supported by a desired pressure to locate the wafer at a position leaving a certain distance from the edge of the pressure setting wall by desirably determining a supplying pressure of the compressed air and the area of the first pressure space.

Further, since the second pressure space, to which the compressed air is overblown from the first pressure space, is communicated with the atmosphere via a throttle opening or openings, supporting pressure acting on the whole wafer may be sufficiently smaller than the vacuum pressure for sucking the peripheral portion of the wafer so that the wafer may be sucked surely onto the receiver.

Advantages of the method of supporting the wafer according to the present invention will be described as follows.

The desired supporting pressure may be given to the center of the wafer by utilizing the compressed air supplied to the first pressure space and the further supporting pressure given to the wafer from the second pressure space is set too close to the atmospheric pressure so that the supporting pressure acting on the whole wafer of large diameter may be controlled to be smaller than the vacuum pressure for securing the wafer.

Therefore, bending or flexion of the wafer due to a pressure of a press roller may be prevented so as to press and apply a tape to the wafer of large diameter and it may prevent bubbles to be sandwiched between the wafer and the tape and then the wafer can be sucked and held onto the table plate so as to prevent the wafer from sliding or shifting.

Further, since the supporting pressure is regulated by means of a clearance between the wafer and the pressure setting wall, it may eliminate scattering or dispersion of the supporting pressure so that the tape can be applied to the wafer stably, and it is not necessary to carry out a maintenance work for regulating the supporting pressure so that its maintenance cost may be reduced greatly.

Further, in the method of supporting the wafer, where the heated compressed air is supplied from a compressed air source to the first pressure space, it is possible to apply the tape to the wafer and the outer frame more easily and certainly.

The wafer supporting apparatus or the wafer mounter according to the present invention may influence the desired supporting pressure to act on the center of the wafer by utilizing the compression air supplied to the first pressure space, and the further supporting pressure acting from the second pressure space to the wafer is set too close to the atmospheric pressure so that the supporting pressure acting on the wafer can be controlled smaller than the vacuum pressure for securing the wafer.

Therefore, bending or flexion of the wafer due to a pressure of a press roller may be prevented so as to press and apply a tape to the wafer of large diameter and it may prevent bubbles to be sandwiched between the wafer and the tape, and then the wafer can be sucked and held onto the table plate so as to prevent the wafer from sliding or shifting.

In the wafer supporting apparatus or the wafer mounter according to the present invention, where the apparatus further comprises a heater fitted with the reverse side of the table plate and a terminal portion of a compressed air supplying passage disposed inside the heater to communicate the compressed air source with the compression air supplying opening, so as to discharge the heated compression air, which is heated in the terminal portion, to the first pressure space, the wafer may be heated with the compressed air so that it may raise the temperature of the wafer to a predetermined one for a short time so as to apply the tape to the wafer.

Other advantages of the present invention will be apparent from the description of the embodiment with reference to the drawings.

BRIEF DESCRIPTION OF THE DRAWINGS

The drawings show an embodiment of the present invention in which.

DETAILED DESCRIPTION OF THE PREFERRED EMBODIMENT

Figure 1:
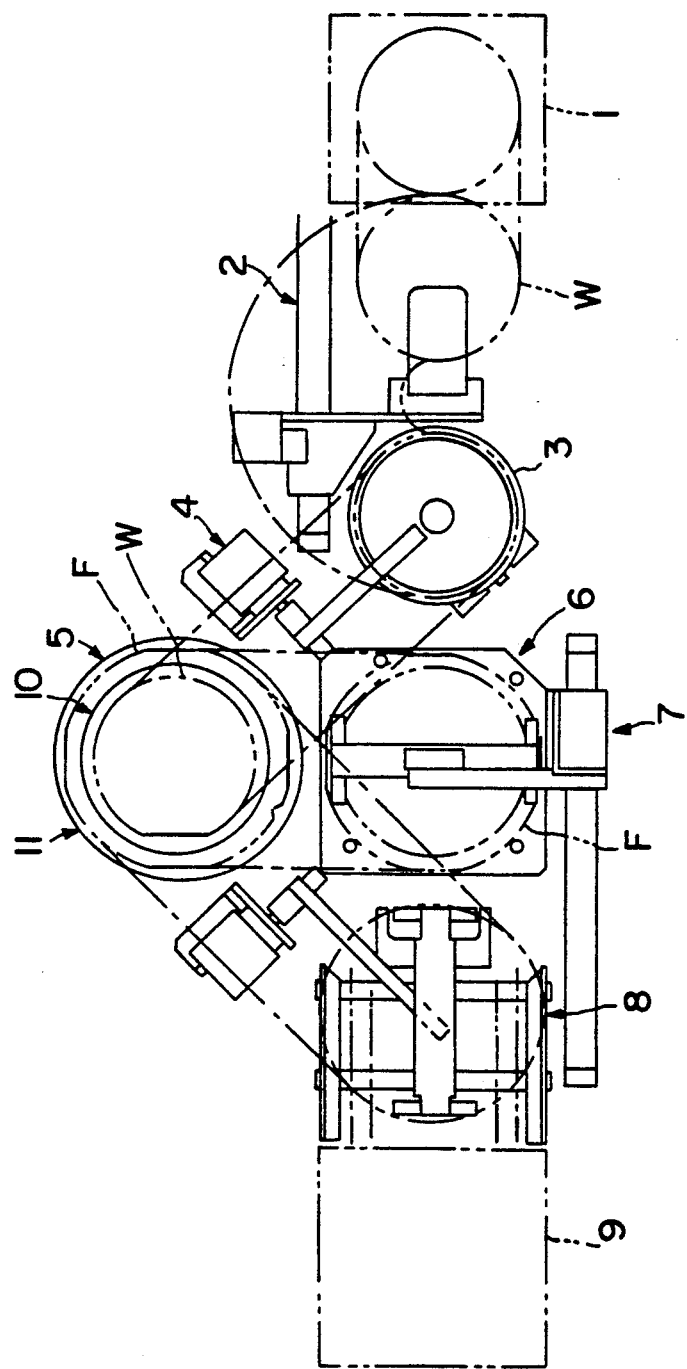
FIG. 1 is a plan view of a wafer mounter according to the present invention.

As shown in FIG. 1, a wafer mounter is constructed as follows:

A wafer take-in device 2 takes in a wafer W one by one from a wafer stock jig 1 and a direction of the wafer W is adjusted by means of a wafer direction determining device 3. Thereafter, the wafer W is, rotated front-to-back and transferred onto a tape applying stage 5 by means of a wafer transfer device 4. On the other hand, an outer frame direction determining device 6, which also fuctions as an outer frame stock jig, rotates an outer frame F front-to-back and regulates a direction of the outer frame. The outer frame F is transferred to the tape applying stage 5 one by one by means of an outer frame transfer device 7.

On the tape applying stage 5, a wafer supporting device 10 for supporting the rotated front-to-back wafer W, and an outer frame supporting device 11 for supporting the rotated front-to-back outer frame F, are arranged coaxially.

Figure 2:
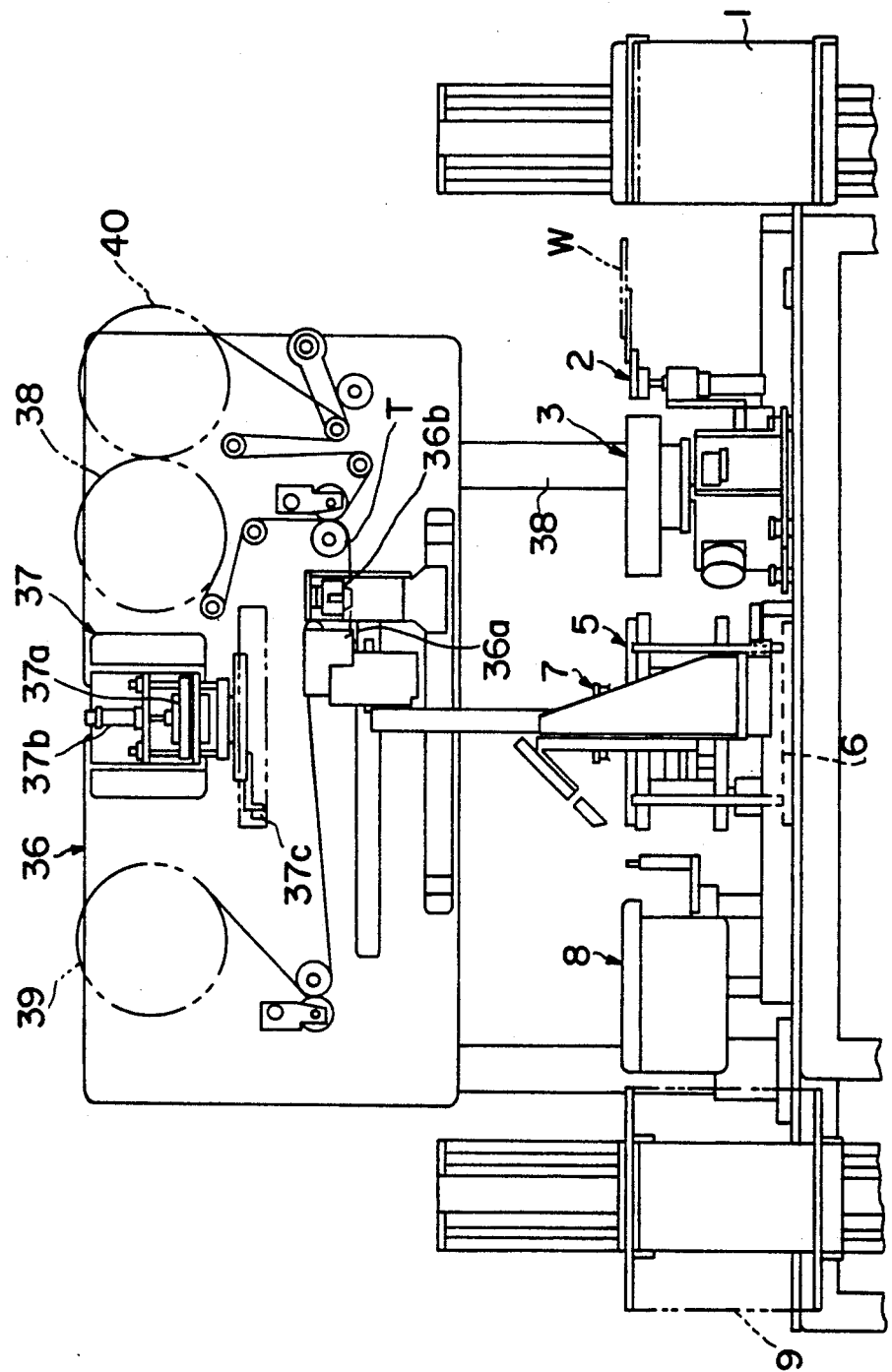
FIG. 2 is a front view of the wafer mounter.

As shown in FIGS. 1 and 2, a tape applying device 36 and a cutter 37 are disposed above the tape applying stage 5. After transferring the wafer W and the outer frame F onto the tape applying stage 5, the tape applying stage 5 is extended upwardly so as to elevate the wafer W and the outer frame F to a predetermined tape applying position.

The tape applying device 36 is constructed as follows:

After the wafer W and the outer frame F are elevated to a tape applying position, a recovery roll 39 winds an unnecessary portion of a tape T from a feed roll 38 for the tape T, so that the tape T can be withdrawn from the feed roll 38 and developed on the upper surface of each of the wafer W and the outer frame F by means of a developing device 36a. The developing device 36a and a press roller 36b are moved from a position above the tape applying stage 5 to another position so that the tape T can be pressed and applied to the reverse side of each of the wafer W and the outer frame F by means of the press roller 36b.

The cutter 37 is constructed as follows:

After the tape T is applied to the wafer W and the outer frame F, a motor 37b and a rotary knife 37c are lowered by means of a cylinder 37a to a cutting position where the rotary knife 37c are contacted with the outer frame F, and then the motor 37b is rotated more than a rotation so as to cut the tape T to be a necessary portion and an unnecessary portion around the necessary portion. Thereafter, the cylinder 37a is retracted so as to elevate the motor 37b and the rotary knife 37c to the first waiting position.

Further, the tape applying device 36 is so constructed as to separate the unnecessary portion of the tape T from the outer frame F by returning the developing device 36a and the press roller 36c from their positons to the first positions above the tape applying stage 5 after the tape T is cut and divided into the necessary portion and the unnecessary portion around the necessary portion.

By the way, the tape T comprises a plastic tape as a base material and a tacky adhesive layer formed with a side of the tape. A separating tape is prepared not to adhere the tacky layer of the tape T against the other surface thereof when the tape T is wound. The separating tape is separated after the tape T is withdrawn from the feed roll 38 and then wound on a separating tape roll 40.

Plastics as a material of the tape T is not particularly limited, but it is preferable to choose a material which is easy to control a thickness of the tape and which has a little variation of its thickness against a tension force. As the material, it may contain for example cellophane, cellulose acetate, polyethylene, polypropylene, polyvinyl chloride, polystyrene, polyester such as polyethylene terephthalate, polycarbonate, polyamide, or polyimide. In this embodiment, the tape T comprises polyvinyl chloride which is inexpensive among the listed materials.

As the tacky adhesive agent of the tape T, it may use those adhesive agents which are normally used as a tacky adhesive agent or an adhesive agent. It is possible to use for example hot-melt adhesive agents or thermoplastic resins. However, it is preferable to use a tacky adhesive agent which is easy to control a coating thickness thereof and does not make the state of adhesion uneven. In view of this, this embodiment uses a thermoplastic resin as a tacky adhesive agent, which comprises epoxy resin as a main component.

Further, as shown in FIGS. 1 and 2, the wafer mounter is constructed to remove the wafer W, the outer frame F and the tape T, which are united into a body, from the tape applying stage while rotating them back-to-front by means of a conveying device 8, and then these are transferred to an outer frame stock jig 9.

Figure 3:
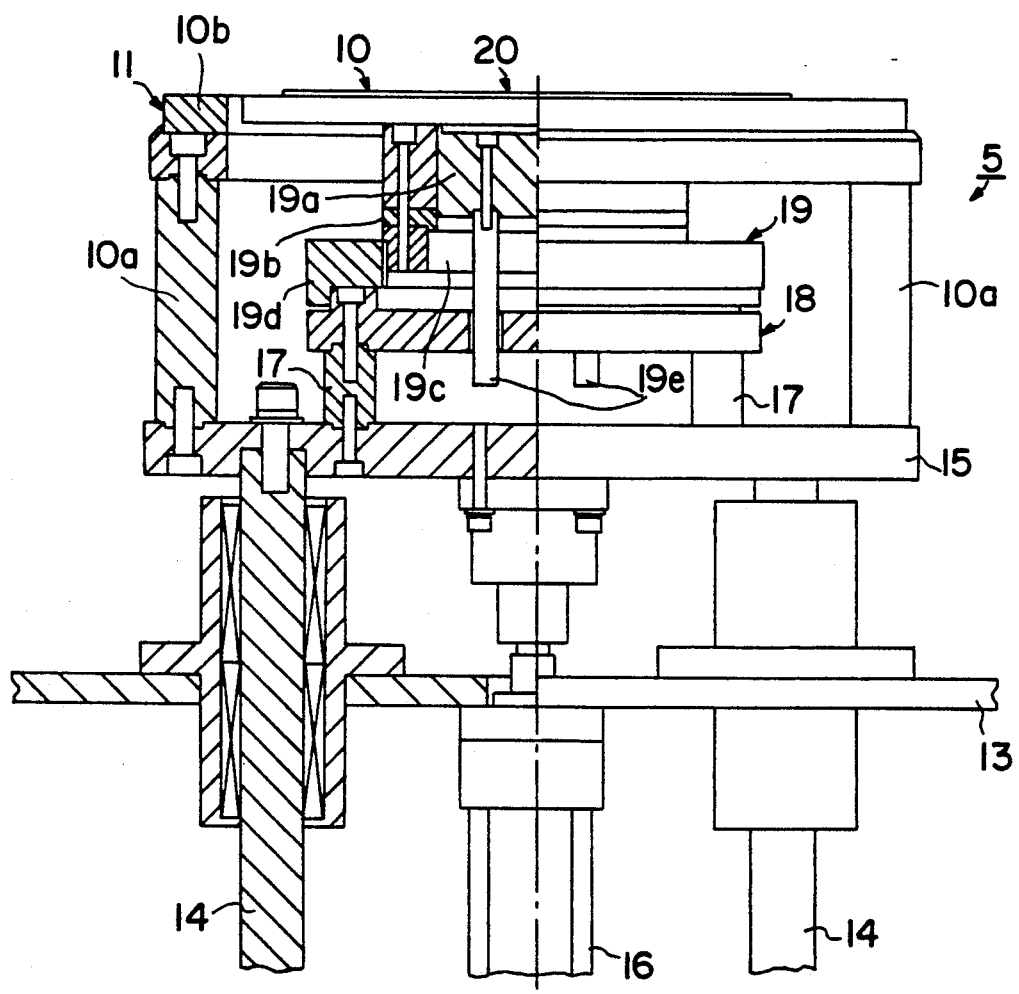
FIG. 3 is a front view of a tape applying stage partially broken away.
Figure 4:
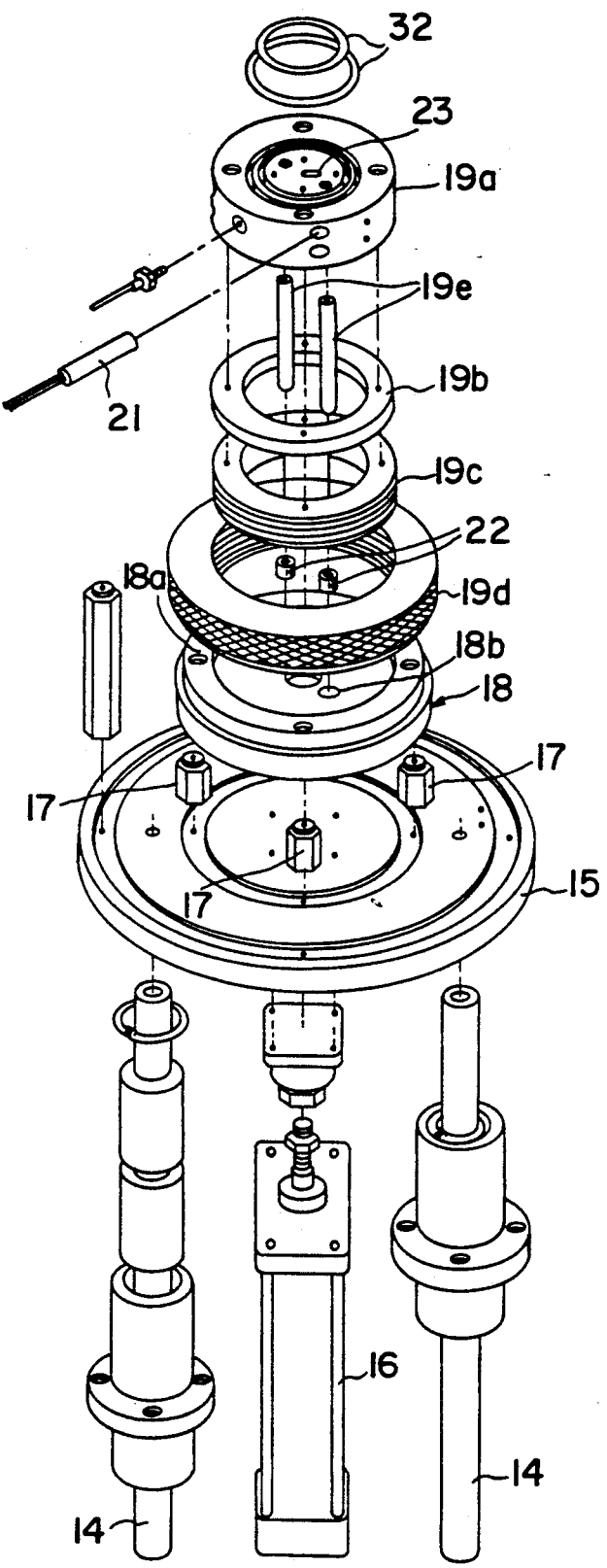
FIG. 4 is a perspective view of an essential portion of the tape applying stage disassembled.

As shown in FIGS. 3 and 4, a pair of shafts 14 and 14 are supported by a frame 13 of the wafer mounter on the tape applying stage 5 to be able to go up and down. An elevating base 15 is fixed to upper ends of the shafts 14 and 14.

The frame 13 supports an air cylinder 16, which is arranged between the shafts 14 and 14, so as to drive the elevating base 15 to go up and down. A wafer supporting device 10 is disposed above a center portion of the elevating base 15 and an outer frame supporting device 11 is positioned around the wafer supporting device 10.

As shown in FIG. 3, the wafer supporting device 10 comprises a heater supporting base 18, a heater unit 19 mounted on the heater supporting base 18, and a table plate 20 mounted on the heater unit 19.

The heater unit 19 comprises a heater block 19a into which an electric heating device 21, as shown in FIG. 4, is inserted, a height adjusting screw 19c is fixed to the reverse side of the heater block 19a via a thermal insulating member 19b, an adjustable nut 19d screw threaded with the height adjusting screw 19c and slidably and rotably mounted on a peripheral edge 18a of the heater block 19a and a pair of guide shafts 19e, fixed to the reverse side of the heater block 19a and inserted into the heater supporting base 18 to be able to move forward and backward.

Further, as shown in FIG. 4, a compressed air passage 23 is formed with the heater block 19a to run from the periphery thereof to a center portion of the upper surface thereof through the interior thereof. The compressed air passage is connected to a compressed air supplying source which is not shown.

By the way, a pair of guide openings 18b and 18b are formed with the heater supporting base 18 for inserting the guide shafts 19e, as shown in FIGS. 3 and 4. Further, a bushing 22, which is slidably engaged with the guide shaft 19e, is fit in each of the guide openings 18b in order to permit raising and lowering of the guide shafts 19e smoothly and precisely.

The table plate 20 is arranged coaxial with the elevating base 15 and the heater unit 19 and fixed on the upper surface of the heater unit 19 by means of, for example, from 2 to 4 bolts 24, as shown in FIG. 4.

Figure 5:
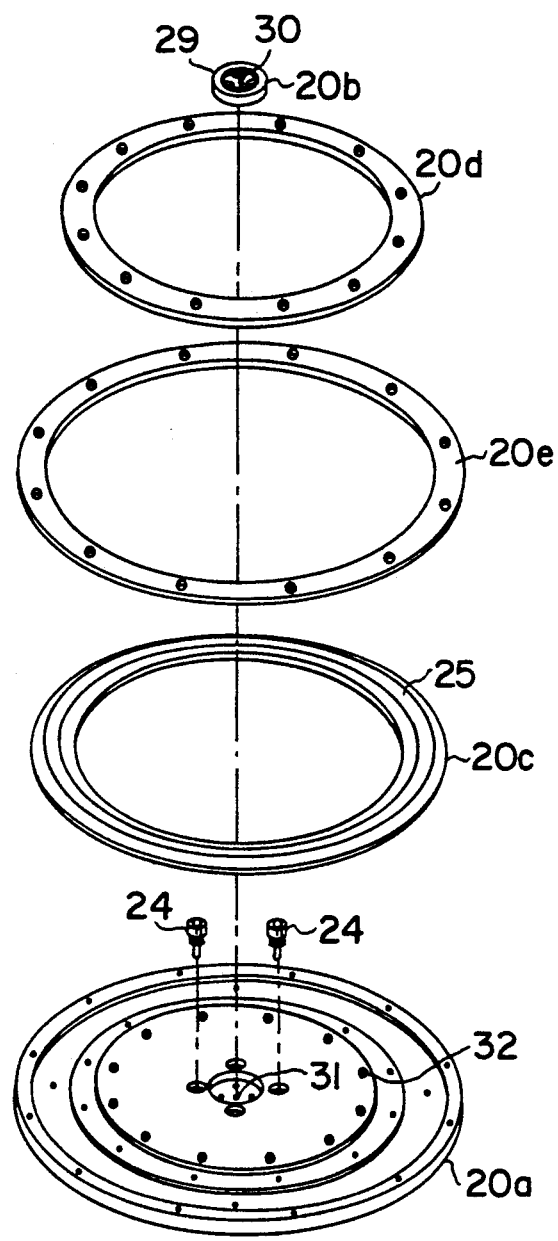
FIG. 5 is a perspective view of a table plate disassembled.
Figure 6:
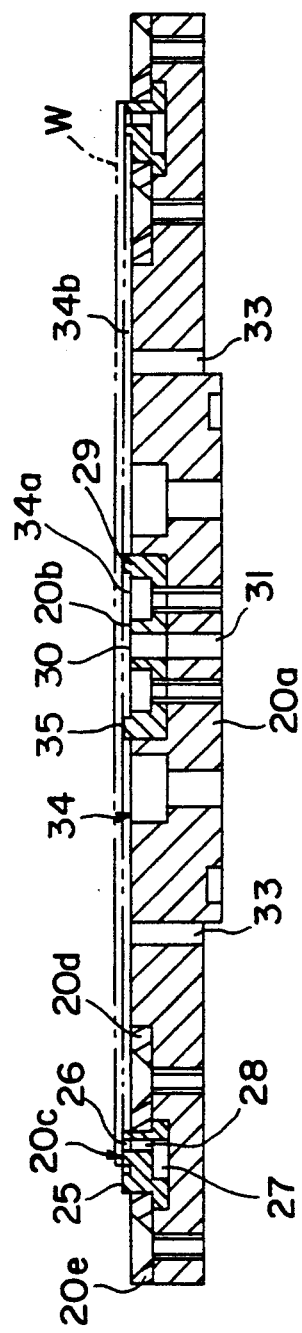
FIG. 6 is a sectional side view of the table plate.
Figure 7:
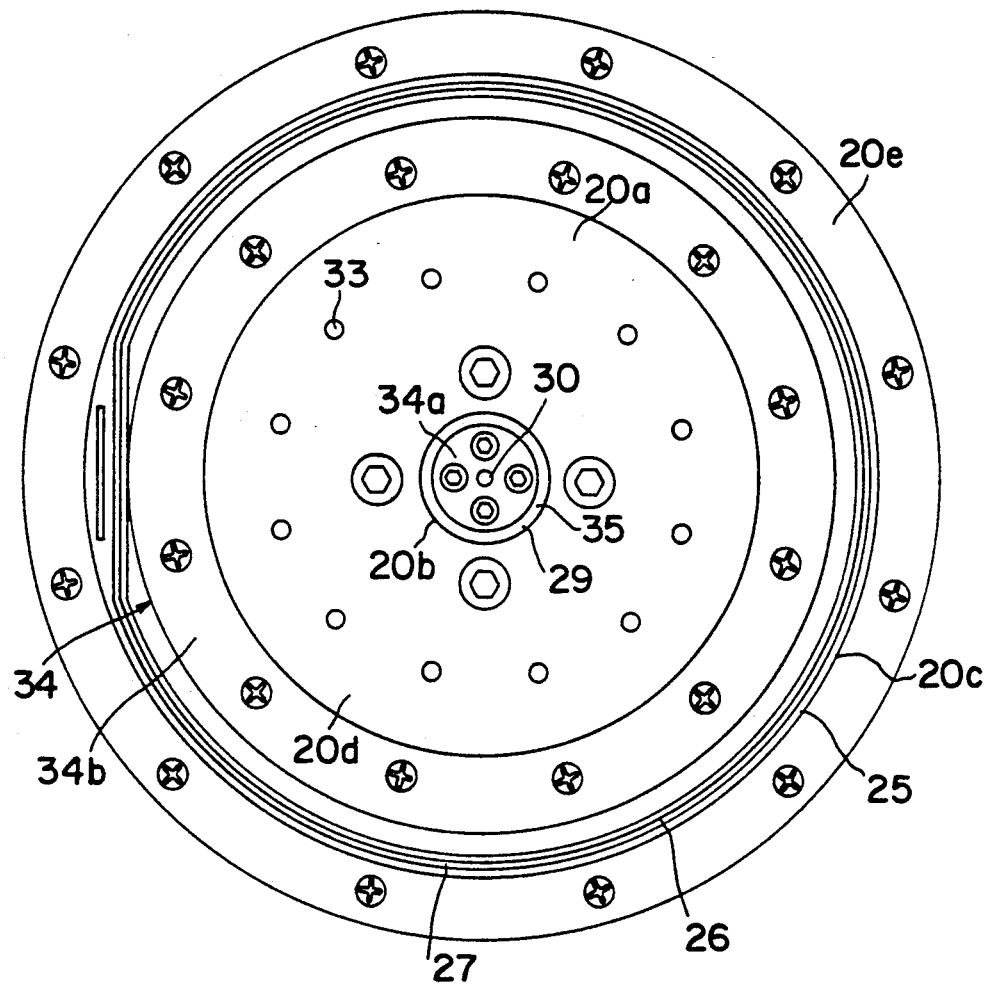
FIG. 7 is a plan view of the table plate.
Figure 8:
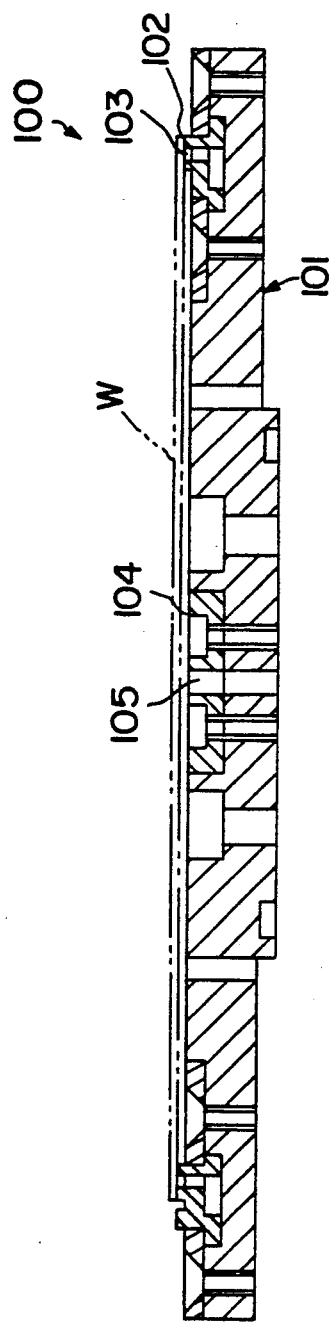
FIG. 8 is a sectional side view of a conventional table plate.

As shown in FIGS. 5 through 7, the table plate 20 comprises a main body 20a of circular shape, a central member 20b made of for example fluororesin and fixed to an upper surface of a center portion of the main body 20a, a peripheral member 20c made of for example fluororesin and fixed to a periphery of the main body 20a, and a pair of inside and outside holding frames 20d and 20e for fixing the peripheral member 20c.

As shown in FIG. 5, the peripheral member 20c provides a receiver 25 of ring shape which projects upwardly corresponding to the periphery of the wafer W. A vacuum opening 26 is formed with the upper surface of the receiver 25 to make a continuous groove which corresponds to the periphery of the wafer W. A vacuum passage 27 in the shape of a ring is formed between the under surface of the peripheral member 20e and the main body 20a. The vacuum opening 26 is connected to a vacuum source, which is not shown, via the vacuum passage 27 and a communicating passage 28 which penetrates the peripheral member 20b vertically.

A pressure setting wall 29 in the shape of a ring is disposed to project from a periphery of the central member 20c, which wall has a height slightly lower than that of the receiver 25. A compressed air supplying opening 30 is formed with the upper surface of a central portion of the central member 20b. Further, a compressed air passage 31 is formed with a central portion of each of the main body 20a and the central member 20b, which passage communicates with a compressed air passage 23 of the heater block 19a.

By the way, as shown in FIGS. 4 and 5, seal members 32 are arranged between the table plate 20 and the heater unit 19 for shutting out both of the compressed air passages 23 and 31 from the atmosphere in a double seal construction in order to maintain precision of pressure control.

Further, a number of throttle openings 33 are formed with an intermediate portion of the main body 20a in a radial direction thereof to penetrate the main body 20a.

By constructing the table plate as mentioned above, a pressure space 34 may be formed between the table plate 20 and the wafer W set on the table plate, in such a state that it is divided inside the receiver 25. Further, the pressure space 34 is divided by the pressure setting wall 29 into a first pressure space 34a located inside and a second pressure space 34b outside the pressure setting wall 29.

Further, the first pressure space 34a is connected to a compressed air supplying source via the compression air passage 31 of the table plate 20, the compressed air passage 23 of the heater block 19a and a micro-regulator which is not shown. The first pressure space 34a and the second pressure space 34b are communicated with each other via a very small throttle passage 35 formed between the wafer W and the upper edge of the pressure setting wall 29. Further, the second pressure space 34b is communicated with the atmosphere via throttle openings 33.

The area of the first pressure space 34a and the size of the throttle passage 35 may be designed according to a supplying pressure of an compressed air and a required supporting pressure for the wafer W. For example, where a pressing force of a press roller 36e of a tape applying device 36, which will be referred to hereinafter, is set between 1.2~2 Kg/cm$^2$, it is better to take such a manner that the supplying pressure of a compressed air to the first pressure space 34a is set about 1.2~2 Kg/cm$^2$, that a diameter of the first pressure space 34a is determined to be about 20 mm, and that a depth and width of the throttle passage 35 may be set about 3 μm with the length being the thickness of the pressure setting wall 29.

The outer frame supporting device 11 comprises two posts 10a standing on the peripheral portion of the elevating base 15, and a receiving frame 10b of ring shape fixed on the upper ends of the posts and having a diameter larger than that of the table plate 20. The height of the upper surface of the receiving frame 10b is set lower than the height of the upper surface of the receiver 25 of the table plate 20 corresponding to a difference of a thickness of each of the wafer W and the outer frame F.

Next, a method of mounting a wafer by using the wafer mounter of the embodiment will be described below.

In the method of mounting the wafer, all of the steps prior to transferring the wafer W to the wafer supporting device 9, and also the step for transferring the wafer W and the outer frame F, to which the tape T is applied, from the tape applying stage 5, may be carried out according to the conventional method. Therefore, detailed descriptions of these steps will be omitted here.

The method of supporting the wafer according to the embodiment of this invention is utilized while the wafer W is transferred in the wafer supporting device 9 and transferred therefrom. Particularly, the method is adopted for the step of pressing and applying the tape T to the wafer W and the outer frame F after the wafer W has been transferred to the wafer supporting device 9.

Namely, the peripheral portion of the reversed wafer W is set on the receiver 25 of the table plate 20 and sucked onto the receiver 25 by operating a vacuum source. Thereafter, the press roller 36c of the tape applying device 36 is moved from a position to another in the tape applying stage 5. While the pressure of the press roller acts on the wafer W via the tape T, a compressed air is supplied from a compression air supplying source to the first pressure space 34a through the compressed air passage 23 of the heater block 19a and the compressed air passage 31 of the table 20. The compression air is regulated and controlled by means of a microregulator to have a pressure of about 1.2~2.0 Kg/cm$^2$.

The compressed air is heated at a temperature of 45°~150° C. and preferably about 60°~130° C., while going through the compressed air passage 23 of the heater block 19a, and then supplied to the first pressure space 34a. The wafer W may be supported by dynamic pressure of the compressed air and static pressure produced by a throttle function of the throttle opening 35.

The supporting pressure for the wafer may be determined by the factors of a supplying pressure of the compressed air, the area of the first pressure space 34a and the depth and width of the throttle opening 35, and it acts on a central portion of the wafer W concentrately. In other words, a desired supporting pressure may be obtained regardless of a radial size of the wafer W by determining desirably the area of the first pressure space 34a, the depth and width of the throttle opening 35 and the supplying pressure of the compressed air. As the result, it may prevent the wafer W from bending downwardly due to the pressure of the press roller 36c and also prevent bubbles from sandwiching between the tape T and the wafer W.

Further, the supporting pressure may be regulated automatically to give a predetermined value to a clearance between the wafer W and the pressure setting wall 29. As the result, the supporting pressure becomes stable and therefore applying of the tape T may be carried out stably. Further, any trouble may be avoided in connection with the apparatus and it is not necessary to carry out maintenance operations such as pressure regulations.

Further, the compressed air blown into the second pressure space through the throttle passage 35 from the first pressure space 34a, is discharged into the atmosphere through the throttle openings 33 so that the compressed air of the second pressure space becomes close to the atmospheric pressure. Therefore, the supporting pressure acting on the wafer W from the second pressure space 34b becomes small and then the supporting pressure acting entirely on the wafer W may be smaller than the sucking pressure acting on the peripheral portion of the wafer W, so that the wafer W can be supported on the receiver 25.

Further, in this embodiment, since the compressed air is discharged into the first pressure space 34a after it is heated in the heater block 19a, the wafer W may be heated effectively at a predetermined temperature for a short time and it becomes easy to adhere the tape T to the wafer W and also the outer frame F.

What is claimed is:

1. In a method of supporting a wafer having a front side and a back side comprising the steps of setting the wafer and an outer frame on a table plate with the front side of said wafer toward the table plate within the outer frame, pressing and applying a tape to the back side of each wafer and the outer frame by means of a roller while sucking a peripheral portion of the wafer towards the table plate, and producing a supporting back-up pressure on the front side of the wafer by means of compressed air, said method further comprising the steps of:

forming said table plate (20) to include a main body (20a) of circular shape; forming a central recess in an upper surface of said table plate; inserting and fixing a central member (20b) in said central recess which is bounded by a pressure setting wall (29) which projects from the recess in the table plate to a position in a vicinity of the front side of the wafer; forming a peripheral member (20c) of said main body;

forming a first pressure space between said central member in said table plate and a center portion of the front side of the wafer on the table plate and said first pressure space is confined by said pressure setting wall (29); forming a second pressure space between said peripheral member (20c), the pressure setting wall (29) and the front side of the wafer on the table plate;

forming a throttle passage between said pressure setting wall and said front side of said wafer which throttles compressed air from said first pressure space to said second pressure space;

producing a desired supporting pressure of said compressed air in said first pressure space and on a front side of the wafer, which is supplied from a compressed air source to the first pressure space;

by means of a throttling function of said throttle passage formed between the pressure setting wall and the front side of the wafer, producing a further desired supporting pressure of said compressed air in said second pressure space which is supplied from the first pressure space to the second pressure space through the throttle passage, and by means of a throttling function of a throttle opening in said second pressure space, said second pressure space being connected with the atmosphere.

2. The method of supporting the wafer as claimed in claim 1, further comprising the step of heating the compressed air and then supplying the compressed air into the first pressure space from the compressed air source.

3. In a wafer supporting apparatus comprising a table plate, said table plate including a main body (20a) of circular shape, a central recess in an upper surface of said table plate, a central member (20b) insert fixed in said central recess which is bounded by a pressure setting wall (29), and a peripheral member (20c) which surrounds said central member and forms a receiver of substantially ring shape that projects from an upper surface of the table plate that corresponds to a peripheral portion of the wafer, a vacuum opening formed with an upper surface of the receiver and connected to a vacuum source, a pressure space between the table plate and the wafer bordered by the receiver, and a compressed air supply opening means formed inside the receiver and with the upper surface of the table plate and connected to a compressed air supply, said pressure setting wall is of ring shape and disposed at a center portion of the table plate to project from the table plate to a position in a vicinity of the wafer set on the receiver and said pressure setting wall divides the pressure space into a first pressure space located within a confined area of the pressure setting wall (29) and a second pressure space located outside said pressure setting wall between said pressure setting wall, said peripheral member (20c), and said wafer, said first pressure space being connected with the compressed air supply opening means, a first throttle means between said pressure setting wall and said wafer that connects said first pressure space to said second pressure space, and a second throttle opening means formed within the table plate to connect the second pressure space with the atmosphere.

4. The wafer supporting apparatus as claimed in claim 3, further comprising a heater disposed to tightly fit an under surface of the table plate, and a compressed air supply passage connecting the compressed air source with the compressed air supply opening means, said compressed air supply passage having a terminal end positioned in the heater, whereby the compressed air heated in the terminal end is discharged directly into the first pressure space.

5. A wafer supporting apparatus as claimed in claim 3 which includes a wafer mounter.

6. A wafer supporting apparatus as claimed in claim 4 which includes a wafer mounter.

* * * * *